United States Patent
Hess et al.

(10) Patent No.: US 9,236,843 B2
(45) Date of Patent: Jan. 12, 2016

(54) SOUND SYSTEM WITH INDIVIDUAL PLAYBACK ZONES

(71) Applicant: Harman Becker Automotive Systems GmbH, Karlsbad (DE)

(72) Inventors: Wolfgang Hess, Karlsbad (DE); Steffen Wagner, Ettlingen (DE)

(73) Assignee: Harman Becker Automotive Systems GmbH, Karlsbad (DE)

( * ) Notice: Subject to any disclaimer, the term of this patent is extended or adjusted under 35 U.S.C. 154(b) by 263 days.

(21) Appl. No.: 13/729,746

(22) Filed: Dec. 28, 2012

(65) Prior Publication Data

US 2013/0170668 A1    Jul. 4, 2013

(30) Foreign Application Priority Data

Dec. 29, 2011    (EP) .................................... 11196080

(51) Int. Cl.
*H03G 3/00* (2006.01)
*H03G 3/20* (2006.01)
(Continued)

(52) U.S. Cl.
CPC .. *H03G 3/20* (2013.01); *H04R 3/12* (2013.01); *H04S 7/30* (2013.01); *H04R 2499/13* (2013.01)

(58) Field of Classification Search
CPC .................................................. H04R 2499/13
USPC .................................................. 381/302, 107
See application file for complete search history.

(56) References Cited

U.S. PATENT DOCUMENTS

2007/0286426 A1*  12/2007  Xiang et al. ..................... 381/17
2008/0071400 A1*  3/2008   Haulick et al. .................. 700/94
(Continued)

FOREIGN PATENT DOCUMENTS

| | | |
|---|---|---|
| EP | 1522868 | 4/2004 |
| EP | 1507440 | 2/2005 |

OTHER PUBLICATIONS

Lindemann, "Extension of a Binaural Cross-Correlation Model by Contralateral Inhibition I. Simulation of Lateralization for Stationary Signals", Journal of Acoustic Society of America, Dec. 1986, p. 1608-1622, vol. 80 (6).
(Continued)

*Primary Examiner* — Paul S Kim
*Assistant Examiner* — Norman Yu
(74) *Attorney, Agent, or Firm* — O'Shea Getz P.C.

(57) ABSTRACT

The invention relates to a sound system in a vehicle. The sound system comprises a first audio signal source providing a first audio signal and a second audio signal source providing a second audio signal. The sound system further comprises loudness determination unit is configured for determining a loudness of the first audio signal based on a psycho-acoustic model of a human hearing and a type information unit configured for establishing type information of the second audio signal. The sound system further comprises a control unit configured for individually selecting, for each of at least two playback zones, a mixing mode depending on the type of the second audio signal, wherein the mixing modes relate to a relation between signal output gains of the first and second audio signals. The control unit is further configured for individually mixing for playback, in each of the at least two playback zones, the first audio signal and the second audio signal based on the selected mixing mode and the determined loudness. The sound system further comprises a plurality of loudspeakers addressing individually the at least two playback zones.

14 Claims, 5 Drawing Sheets

(51) Int. Cl.
*H04R 3/12* (2006.01)
*H04S 7/00* (2006.01)
*H04R 5/02* (2006.01)

(56) References Cited

U.S. PATENT DOCUMENTS

| | | |
|---|---|---|
| 2008/0273722 A1 | 11/2008 | Aylward et al. |
| 2009/0232320 A1* | 9/2009 | Azizi et al. ............ 381/57 |
| 2009/0259365 A1* | 10/2009 | Rohlfs et al. ............ 701/41 |

OTHER PUBLICATIONS

Hess et al., "Acoustical Evaluation of Virtual Rooms by Means of Binaural Activity Patterns", Audio Engineering Society Convention Paper, 115th Convention, Oct. 2003.

"Recommendation ITU-R BS.1770-1 Algorithm to measure audio programme loudness and true-peak audio level", Jan. 2006, http://webs.uvigo.es/servicios/biblioteca/uit/rec/BS/R-REC-BS.1770-1-200709-I]]PDF-E.pdf.

* cited by examiner

SOUND SYSTEM WITH INDIVIDUAL PLAYBACK ZONES

CLAIM OF PRIORITY

This patent application claims priority from EP Application No. 11 196 080.3 filed Dec. 29, 2011, which is hereby incorporated by reference.

FIELD OF TECHNOLOGY

This invention relates to a sound system comprising a first audio signal source and a second audio signal source and a plurality of loudspeakers addressing individually at least two playback zones and a method of mixing the first and the second audio signals individually in the at least two playback zones. The invention especially finds application in vehicles, where multimedia systems are used comprising a navigation module and an audio module such as a radio receiver, compact disc unit, etc.

RELATED ART

Motor vehicle navigation systems as such have been known for a relatively long time and are increasingly offered in new vehicles or retrofitting purposes. In this context, the navigation systems are used to guide the driver of the vehicle from the present location to a destination location. In many systems the guiding is done by announcing to the driver how to behave at an upcoming location. By way of example, a navigation system may alert the driver by an announcement audio signal that he has to turn right at the next traffic light (e.g., "turn right in two hundred meters").

In modern vehicles, there exists a wide variety of such announcement audio signals. Other types of announcement signals can be, e.g., telephone calls, park distance control audio information, gongs, etc.

Often the driver is also using an entertainment audio source such as a radio or a compact disc together with the announcement signals. In case of an announcement, the announcement sound signal is mixed to the sound signal of the other audio signal source which is called entertainment sound source in the present application. Methods are known which adapt the average output level of the entertainment sound source when an announcement audio signal is present in order to allow for audibility of the announcement audio signal.

However, the large number of announcement signals used and present in a modern vehicle typically requires a frequent intervention of the playback of the entertainment audio signal which can cause disturbance to the users.

Accordingly, there is a need to provide techniques for mixing audio signals in a more efficient and flexible way.

SUMMARY OF THE INVENTION

According to an aspect, a method of mixing a first audio signal and a second audio signal individually in at least two playback zones of a vehicle is provided. The method comprises receiving the first audio signal and the second audio signal and determining a loudness of the first audio signal based on a psycho-acoustic model of human hearing. The method comprises establishing type information of the second audio signal and individually selecting, for each of the at least two playback zones of the vehicle, a mixing mode depending on the type information of the second audio signal. The mixing mode relates to a relation between signal output gains of the audio signals. The method further comprises individually mixing for playback, in each of the at least two playback zones, the first audio signal and the second audio signal based on the selected mixing mode and based on the determined loudness.

In particular, the first audio signal may relate to an entertainment audio signal received from an entertainment audio source such as a CD, cassette, radio, internet, or the like. Also the second audio signal may relate to an announcement signal. Different types of announcement signals may be received. For example, the type information may relate to one of the following: navigation instructions, front park distance control audio signal, rear park distance control audio signal, status indication of a telephone call, telephone call, front gong, rear gong.

By individually mixing the first and the second audio signals based on a mixing mode, it may be possible to adapt the mixing characteristics according to the needs of users located in the different playback zones. It may then be possible to synchronously playback the respective audio signals in each playback zone. By way of example, the second audio signal may be relevant to a user located within a first playback zone and less relevant to users located within the second playback zone as indicated by the type information, while the opposite applies to the first audio signal. Then mixing modes may be selected based on the type information of the second audio signal.

For example, the type information of the second audio signal may be established based on a known audio signal source of the second audio signal. For example, the second audio signal may relate to navigation instructions and therefore the type information may be established accordingly. For example, the type information may be established because the second audio signal in the form of navigation instructions originates from a navigation device.

It may then be possible to select a mixing mode based on predefined settings linking type information with mixing modes individually for the at least two playback zones of the vehicle. For example, if the type information specifies "navigation instructions", a predefined relation may allow selecting the mixing mode for the playback zones such that the navigation instructions are mixed to the first audio signal using a large signal output gain for the playback zone of the driver and a small signal output gain for the playback zone of the rear seat passengers. Then passengers in the front seat may perceive the navigation instructions loudly, while rear seat passengers may not or only at low loudness hear the navigation instructions. However, it may also be possible that users specify the mixing modes used for certain type information by their own according to their preferences.

Therefore, because the mixing mode may be selected based on the type information, a flexible and situation-specific mixing may be achieved.

The loudness may be determined using a psycho-acoustic model of the human hearing alone or in combination with signal statistics of the audio input signal. One possibility for a loudness estimation is described in Recommendation ITU-R BS 1770-1 ("Algorithms to Measure Audio Program Loudness and to a Peak Audio Level"). In the present application loudness may be estimated through a binaural localization model. This binaural model simulates the spatial perception of the audio input signal and may allow to determine whether the audio input signal contains mainly noise or any other input signal such as music or speech.

Mixing for playback may comprise receiving at least one reference signal output gain related to a volume setting and calculating a first signal output gain and a second signal output gain based on the at least one reference signal output gain and the mixing mode and the determined loudness. Then mixing may further comprise amplifying the first audio signal using the first signal output gain and amplifying the second audio signal using the second signal output gain. Last, mixing may comprise mixing the amplified first and second audio signals to obtain a single audio signal.

For example, a volume setting by the user may specify an average signal output level via the reference signal output gain. The reference signal output gain may be seen as a base line for amplification of the first and second audio signals. Based on this reference signal output gain, a first and a second signal output gain used to amplify the first and the second audio signals may be calculated. Then the first signal output gain may have a different or equal value than the second signal output gain resulting in equal or different averaged signal output levels for the first and second audio signals.

In general, a larger volume setting may result in a larger averaged signal output level, for example via a larger reference signal output gain, while the actual signal output level may vary as a function of time because the determined loudness may also vary as a function of time. Moreover, the mixing mode which is selected may determine an overall signal output gain setting during the presence of a second audio signal.

It should be understood that it is also possible that the reference signal output gain is different for the first and the second audio signals. For example, one volume setting may result in different reference signal output gains for the first and the second audio signal.

When individually mixing based on a first mixing mode, a first signal output gain of the first audio signal may be decreased based on the loudness if compared to a second signal output gain of the second audio signal. In other words: the amount of decreasing the first signal output gain may equal a certain amount which, in turn, may depend on the loudness. Then the signal output level of the second audio signal averaged over time may be larger than the averaged signal output level of the first audio signal. Increased audibility of the second audio signal, e.g., the announcement audio signal may thus be achieved.

In particular, in the first mixing mode the second signal output gain may be equal to a reference signal output gain related to a volume setting and the first signal output gain may be decreased if compared to the reference signal output gain. This may have the effect that the averaged signal output level of the first audio signal is decreased by a certain amount if compared to the level desired by the user via the volume setting. In other words: the user may perceive the mixing of the announcement signal to the entertainment signal as an attenuation of the entertainment signal while the announcement signal is output at the signal level desired by the volume setting. Of course it may also be possible to output the announcement signal at an averaged signal output level which is, e.g., above the level desired by the volume setting. It may also be possible to set the relation between the reference signal output gain and the first and second signal output gains as a function of the determined loudness of the first audio signal.

Other mixing modes may be possible. For example, when individually mixing based on a second mixing mode, a first signal output gain of the first audio signal may be left unaltered if compared to a reference signal output gain related to a volume setting and a second signal output gain of the second audio signal may be increased if compared to the reference signal output gain.

For example, when mixing in the first mixing mode or the second mixing mode, the relation between the signal output gains of the first and second audio signals may be: signal output gain of the second audio signal is larger by a predefined factor than signal output gain of the first audio signal, wherein the predefined factor decreases for increasing loudness and wherein the signal gain of the second audio signal remains constant below a threshold loudness.

By providing a constant signal output gain for the second audio signal below a threshold loudness, audibility of the announcements et cetera may be ensured even when the first audio signal has a very low loudness value. Furthermore, by having the signal output gain of the second audio signal larger than the signal gain of the first audio signal, the averaged signal output level of the second signal may be larger than the averaged signal output level of the first signal and therefore audibility of the announcements may be ensured at all times.

When individually mixing based on a third mixing mode, a second signal output gain of the second audio signal may be set to zero. This corresponds to an averaged signal output level of the second audio signal which is equal to zero. For example mixing in a third mixing mode may be desired when a certain announcement signal, i.e., second audio signal is less relevant to users located within a respective playback zone. Another example for using the third mixing mode may be that a certain sound signal should originate from a certain playback zone. For example, it may be desired to have certain audio signals connected with events located behind the driver originating from the respective playback zone in the back of the vehicle. In this example, the mixing mode in the front playback zone may be the third mixing mode and the mixing mode in the rear playback zone may be the first or second mixing mode.

Then, for example if the type information of the second audio signal relates to navigation instructions or status indication of a telephone call, the first mixing mode may be selected for a first playback zone targeted at front seat passengers of the vehicle and the third mixing mode may be selected for a second playback zone targeted at rear seat passengers of the vehicle. Status indication of a telephone call may relate to, e.g., dialing tone, line busy signal, etc. In such a situation, distraction of the rear seat passengers may be reduced. Navigation instructions may only be relevant to the driver of a vehicle. Then by setting the second signal output gain of the second audio signal to zero for playback in the respective playback zone, distraction of rear seat passengers may be reduced.

Also, if the type information of the second audio signal relates to rear park distance control audio signal or rear gong, the third mixing mode may be selected for a first playback zone targeted at front seat passengers of the vehicle and the second mixing mode may be selected for a second playback zone targeted at rear seat passengers of the vehicle. A rear gong may occur if, e.g., a rear door is open or the trunk lid is open.

Accordingly, if the type information of the second audio signal relates to front park distance control audio signal or front gong, the second mixing mode may be selected for a first playback zone targeted at front seat passengers of the vehicle and the third mixing mode may be selected for a second playback zone targeted at rear seat passengers of the vehicle.

For example, it may not be necessary to reduce the averaged signal output level of the first audio signal, e.g., an entertainment signal, for a situation of engaged park distance control. The second audio signal may be mixed on top of the first audio signal. This may reduce distraction of passengers in the vehicle.

According to a further aspect, a sound system in a vehicle is provided. The sound system comprises a first audio signal source providing a first audio signal and a second audio signal source providing a second audio signal. It further comprises a loudness determination unit configured for determining a loudness of the first audio signal based on a psycho-acoustic model of a human hearing and a type information unit configured for establishing type information of the second audio signal. It further comprises a control unit configured for individually selecting, for each of at least two playback zones of the vehicle, a mixing mode depending on the type information of the second audio signal, wherein the mixing modes relate to a relation between signal output gains of the first and second audio signals, and configured for individually mixing for playback, in each of the at least two playback zones, the first audio signal and the second audio signal based on the selected mixing mode and the determined loudness. The sound system further comprises a plurality of loudspeakers addressing individually the at least two playback zones.

For example, the plurality of loudspeakers may address at least two playback zones, each targeting to one or more of the following: driver in a front seat of the vehicle, co-driver in a front seat of the vehicle, passenger in a left rear seat of the vehicle, passenger in a right rear seat of a vehicle.

For a system having such a configuration, effects may be obtained which correspond to the effects discussed with respect to the corresponding methods above.

These and other objects, features and advantages of the present invention will become apparent in light of the detailed description of the embodiments thereof, as illustrated in the accompanying drawings. In the figures, like reference numerals designate corresponding parts.

DESCRIPTION OF THE DRAWINGS

In the following, the invention will be explained in further detail with respect embodiments illustrated in the accompanying drawings. In these drawings.

DETAILED DESCRIPTION OF THE INVENTION

Figure 1:
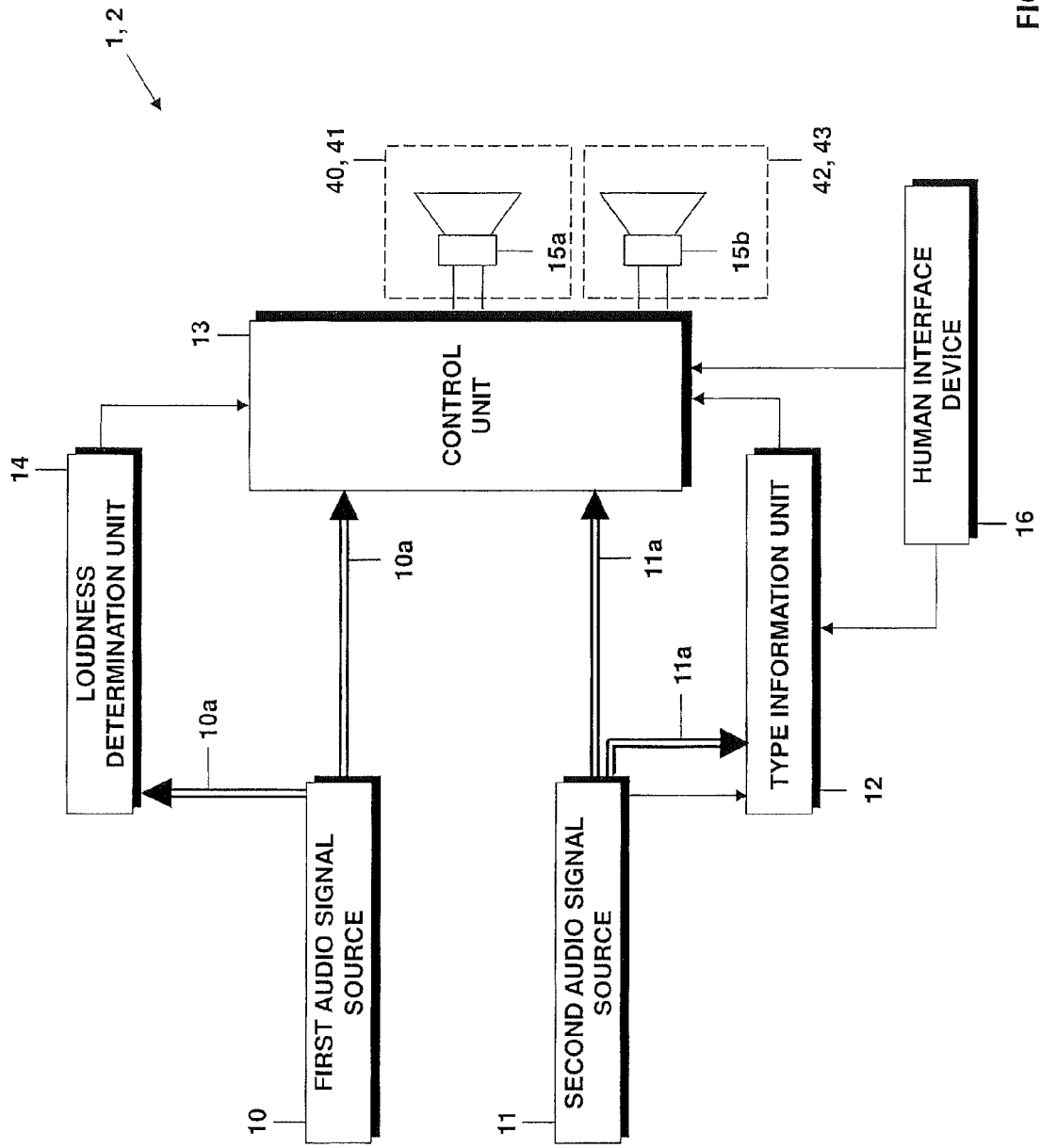
FIG. 1 is a schematic illustration of a sound system.

In FIG. 1, a schematic view of a sound system 2 comprising different sound sources 10, 11 is shown. The sound system 2 of FIG. 1 can be part of a multimedia system of a vehicle 1 comprising different modules such as a navigation unit, a radio receiver, a MP3 player, a CD player, etc.

The sound system 2 of FIG. 1 comprises the first audio signal source 10 in the form an entertainment audio signal source 10 and the second audio signal source 11 in the form of an announcement audio signal source 11. The entertainment audio signal source 10 outputs an entertainment audio signal 10a, the announcement audio signal source outputs an announcement audio signal 11a when needed.

Examples for the announcement audio signal 11a are announcements relating to navigation instructions, fuel level, or other status information of the vehicle 1 including park distance control sound indication or a gong. It is also possible that the announcement audio signal 11a relates to a telephone call or to telephone call status signals, such as line busy, waiting for other party, etc. Different types of announcement audio signals 11a in particular are targeted at different passengers of the vehicle 1.

Figure 2:
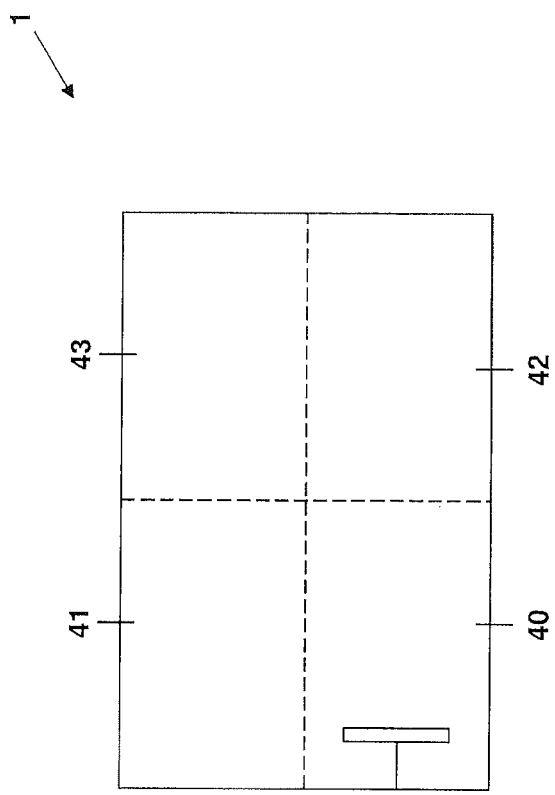
FIG. 2 is a schematic illustration of playback zones within a vehicle.

For this, reference is made to FIG. 2. In FIG. 2, the interior of vehicle 1 is schematically depicted. Driving direction of the vehicle 1 in FIG. 2 is from right to left. The interior of vehicle 1 in the case of FIG. 2 includes four playback zones 40, 41, 42, 43. For example, the playback zone 40 is targeted at a driver of the vehicle 1 in a front seat of the vehicle 1. Also, the playback zone 41 is targeted at a front seat passenger of the vehicle 1, i.e., a co-driver. The playback zones 42 and 43 are targeted at rear seat passengers of the vehicle 1. The type and number of playback zones may vary and depend on, e.g., the type of the vehicle, the number of loudspeakers, etc.

Referring again to FIG. 1, different types of announcement audio signals 11a are targeted at different passengers of the vehicle and therefore may be targeted at different playback zones or a combination of playback zones as discussed with respect to FIG. 2. For example, the announcement audio signal 11a with type information "navigation instruction" may be relevant for the driver of the vehicle 1. Therefore, such an announcement audio signal 11a is targeted at the playback zone 40 of the vehicle 1 in FIG. 2. Differently, for example an announcement audio signal 11a with type information "telephone call" may be relevant for a rear seat passenger of the vehicle and therefore is targeted at the combined playback zones 42 and 43 of the vehicle 1 in FIG. 2. Such examples are not to be construed as limiting. Different and variable associations of playback zones with type information are possible.

Different possibilities of establishing the type information are possible. It is possible that a type information unit 12 establishes the type information based on the audio signal 11a itself or based on an input obtained from the second audio signal source 11 or based on a combination thereof. It is also possible that via a human interface device 16 a user establishes the type information for a certain second audio signal 11a. Another possibility is that the type information unit 12 detects the origin of a certain second audio signal 11a, i.e., detects the certain second audio signal source 11 from, e.g., information contained in a header of the second audio signal 11a received in a packetized format via a bus system, and based on this information establishes the type information.

With respect to FIG. 1, for example the type information unit 12 establishes the type information of the announcement audio signal 11a and inputs the type information into a control unit 13. Also the audio signals 10a, 11a are fed to the control unit 13.

Additionally, a loudness determination unit 14 is provided which determines the loudness of the entertainment sound signal 10a. The determined loudness is also fed to the control unit 13.

The loudness determination unit 14 can determine the loudness with methods known in the art and as described inter alia in ITU-R BS 1770-1 ("Algorithms to Measure Audio Program Loudness and to a Peak Audio Level"). The loudness determination unit 14 can furthermore use a binaural model of the human hearing for determining the loudness and for determining whether and where the audio signal 10a may be localized by a user when hearing said audio signal.

This binaural model simulates the spatial perception of the audio signal and allows to determine whether the audio input signal contains mainly noise or any other input signal such as music or speech. The localization of the audio input signal is described in more detail in EP 1 522 868 A1, in the document W. Lindemann "*Extension of a Binaural Cross-Correlation*

Model by Contralateral Inhibition I. Simulation of Lateralization for Stationary Signals" in Journal of Acoustic Society of America, December 1986, p. 1608-1622, Vol. 80(6), or in the document "*Acoustical Evaluation of Virtual Rooms by Means of Binaural Activity Patterns*" by W. Hess et. al. in Audio Engineering Society Convention Paper, 115th Convention. October 2003. This localization technique allows to discriminate noise from other sound signals.

The control unit 13 selects a mixing mode for each of the playback zones 40, 41, 42 and 43. The control unit 13 mixes these two audio signal 10a, 10b based on the selected mixing mode and outputs a combined audio output signal via loudspeakers 15a, 15b. The loudspeakers 15a, 15b are targeted at the different playback zones 40, 41, 42, 43. For example, if two loudspeakers 15a, 15b are provided, then two playback zones can be addressed either alone or in combination.

In the control unit 13, the signal output gains of the entertainment sound signal and of the announcement sound signal are calculated based on the mixing mode. In particular, which mixing mode is selected depends on the type information received from the type information unit 12. For playback in the different playback zones 40, 41, 42, 43 via e.g., the different loudspeakers 15a, 15b, different mixing modes can be selected.

Possible different mixing modes are illustrated in the FIGS. 3a, 3b, 3c. In FIG. 3a, a first mixing mode 50 is depicted, where, based on the determined loudness 30 of the entertainment audio signal, the signal output gains of the audio signals 10a, 11a of FIG. 1 are adapted such that a certain average signal output level 32 is achieved for the two signals. The average signal output level can correspond to an average of the output level of each of the two audio signals 10a, 11a taken over an extended period of time, e.g., over the duration of a few seconds, the duration of an audio track or over the duration of a number of audio tracks.

In FIG. 3a, the long dashed line indicates the correspondence between determined loudness 30 of the first audio signal 10a and average signal output level 32 if no adaptation of the signal output gains was present, i.e., the long dashed line indicates a reference signal output level. For example, an increased loudness 30 over a certain period of time relates to an increased average signal output level 32. If the user increases or decreases the volume setting, the long dashed line, i.e., the reference signal output level, may be shifted to higher or lower values or may have an increased/decreased slope.

In the first mixing mode 50, the signal output gain of the first audio signal 10a is decreased based on the determined loudness 30 if compared to a reference signal output gain. The reference signal output gain determines the reference signal output level indicated by the long dashed line in FIG. 3a. At the same time, the signal output gain of the second audio signal 11a, i.e., the announcement audio signal 11a, is adapted for values of the loudness 30 above a threshold loudness to be equal to the reference signal output level.

In FIG. 3b, a second mixing mode 51 is graphically indicated. In the second mixing mode 51, the signal output gain of the first audio signal 10a is not adapted if compared to the reference signal output gain. Therefore, the average signal output level 32 of the first audio signal 10a is coincident with the reference signal output level indicated by the dashed line in FIG. 3b. At the same time, the signal output gain of the second audio signal 11a is adapted such that the average signal output level 32 of this second audio signal 11a is above the reference average signal output level.

In FIG. 3c, a third mixing mode 52 is indicated. In the third mixing mode 52, again the average signal output level 32 of the first audio signal 10a is adapted such that it is equal to the reference signal output level indicated by the long dashed line. However, differently to FIG. 3b, the signal output gain of the second audio signal 11a is set to zero resulting in a zero average signal output level 32 for the second audio signal 11a.

Different scenarios linking type information of the announcement audio signal 11a to one of the mixing modes 50, 51, 52 are possible. For example, the third mixing mode 52 as indicated in FIG. 3c relates to a situation where the announcement audio signal 11a is not played in a playback zone at all because the respective signal output gain is set to zero. Such a situation can be desired in case, for example, where the type information of the second audio signal 11a relates to navigation instructions. This is because navigation instructions are typically only relevant for the driver of a vehicle. Therefore, for the playback targeted at rear seat passengers of the vehicle, it might be desired to choose the third mixing mode 52 of FIG. 3c. At the same time, it may be desired to choose the first mixing mode 50 for mixing first and second audio signals 10a, 11a in the case of navigation instructions for the playback zone targeted at the driver of the vehicle. In such a situation the driver may clearly perceive the driving instructions.

Another possible scenario would be a park distance control audio signal indicating a distance between an obstacle and the rear of the vehicle. In such a situation it may be desired to use the second mixing mode 51 for mixing audio signals 10a, 11a in the playback zone targeted at the rear seat passengers of the vehicle. At the same time, the third mixing mode 52 of FIG. 3c may be chosen for mixing the audio signals in the playback zone targeted at the front seat passengers of the vehicle. For example, in such a situation the front seat passengers may still clearly perceive the audio instructions of the park distance control and intuitively perceive them as originating from the back of the vehicle where the distance to an obstacle is actually indicated.

A similar scenario occurs for park distance control relating to the distance between an obstacle in front of the vehicle. Then, the third mixing mode 52 of FIG. 3c may be chosen for mixing the audio signals 10a, 11a in the playback zone targeted at the rear seat passengers and either the first mixing mode 50 or the second mixing mode 51 may be chosen for mixing the audio signals 10a, 11a for playback in the playback zone targeted at the front seat passengers.

Yet another scenario is that a telephone call is targeted at a certain passenger of the vehicle. Turning back to FIG. 1, it is possible to specify manually by the user via a human interface device 16 the playback zone for which the first or second mixing modes 50, 51 are chosen relating to audible playback of the second audio signal in the form of the telephone call. The other playback zones can be set according to the third mixing mode 52 such that the telephone call has a reduced audibility in these playback zones.

The mixing modes as illustrated in FIGS. 3a, 3b, 3c are not to be construed as being limiting. For example, in the above example of the telephone call, it may be desired to have a fourth mixing mode which corresponds to a situation where the signal gain of the first audio signal is set to zero. This may be done in order not to disturb the telephone call by playback of an entertainment source. At the same time, playback of the entertainment audio signal may proceed in a different playback zone. Many other embodiments of mixing modes are possible.

Figure 4:
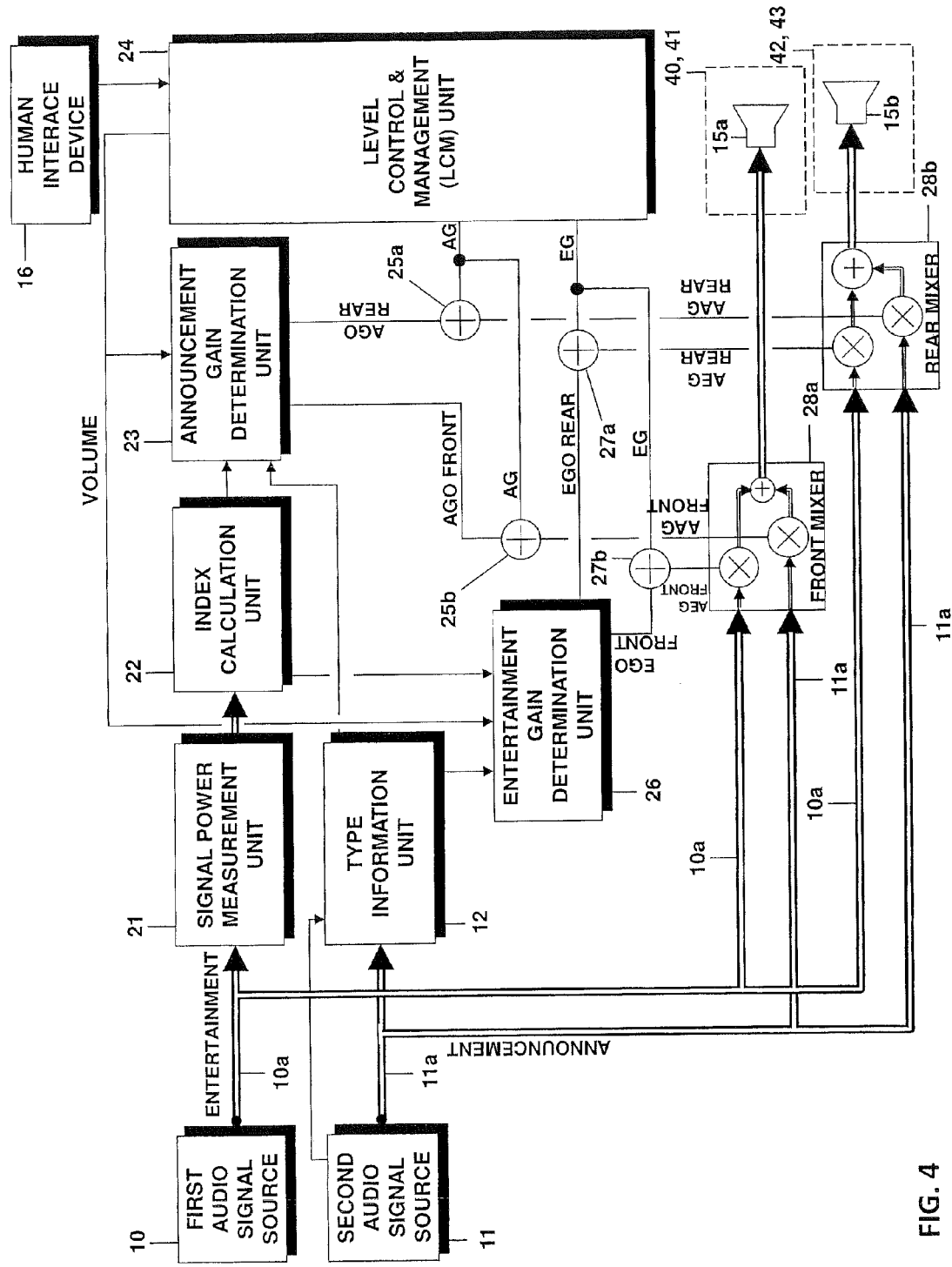
FIG. 4 is a schematic illustration of a sound system.

In FIG. 4, an embodiment of a sound system 2 for automatically adjusting the entertainment sound signal 10a relative to the announcement sound signal 11a is shown. In particular, the sound system 2 of FIG. 4 comprises a level control and management unit 24 providing a reference signal gain based on a volume setting.

A type information unit 12, as already discussed with respect to FIG. 1, determines type information for the second audio signal 11*a*, i.e., the announcement audio signal, and outputs the established type information to an entertainment gain determination unit 26 and an announcement gain determination unit 23.

The entertainment sound signals 10*a*, which can be provided in N different channels, are input to a signal power measurement unit 21 in which the maximum and the mean signal power of the entertainment signal is determined and in which the signal power is transferred into a loudness value based on a psycho-acoustic model of human hearing.

The maximum and the mean signal power are then fed to an index calculation unit 22. In the index calculation unit 22, the signal course of the maximum and the mean signal power is evaluated and an average signal level is determined. The unit 22 helps to recognize whether the entertainment sound signal has a constant high signal level or whether the entertainment signal comprises short time maximums, as it is the case when a beat is contained in the signal. The determined index representing the average loudness of the entertainment signal is then fed to the announcement gain determination unit 23. It should be understood that the average loudness of the entertainment sound signal can be determined in any other way by other approximation methods known in the art.

The units 21 and 22 of FIG. 4 correspond to the loudness determination unit 14 of FIG. 1. To this respect it should be understood that while in the embodiment of FIG. 4 the units 21 and 22 are indicated as separate units, they can be implemented in one unit, e.g., as hardware or software.

This announcement gain determination unit 23 receives the volume as adjusted, e.g., by a user from the level control and management unit 24, the volume representing the volume adjusted by the user of the system at a volume control button provided on a human interface device 16. In most cases this button is a turn button or a rocker, and by turning the button to the right or to the left or by pushing one side of the rocker or the other the volume can be increased and decreased, respectively.

On the basis of the adjusted volume and the received index, the announcement gain determination unit 23 determines a front announcement gain offset AGO Front and a rear announcement gain offset AGO Rear. These values might be positive or negative and describe a corrected announcement level for a front playback zone 40, 41 and a rear playback zone 42, 43. These two playback zones can be addressed via, e.g., two loudspeakers 15*a*, 15*b* separately. The gain offsets AGO Rear, AGO Front can have different values, but also may have the same values. The gain offsets are adapted such that certain averaged signal output levels are achieved at playback as discussed with respect to FIGS. 3*a*-3*c*.

These announcement gain offsets AGO Front, AGO Rear are then added to a reference announcement gain AG at adders 25*a*, 25*b* individually for the two playback zones separately. When the announcement gain offsets AGO Front, AGO Rear are added to the reference announcement gain AG in the adders 25*a*, 25*b*, the result are adapted announcement gains AAG Front and AAG Rear.

The adjusted volume is additionally output from level control and management unit 24 to the entertainment gain determination unit 26. Also, the index calculated by index calculating unit 22 is output to the entertainment gain determination unit 26. The entertainment gain determination unit 26 outputs two entertainment gain offsets EGO Front and EGO Rear which are individually added to a reference entertainment gain value EG in adders 27*a*, 27*b*. EGO Front and EGO Rear relate to the front 40, 41 and rear 42, 43 playback zones addressed via loudspeaker 15*a*, 15*b*. Therefore, also the values of gain offsets EGO Front and EGO Rear can be different or equal. The two added signals in adders 27*a*, 27*b* result in the adapted entertainment gains AEG Front and AEG Rear.

The reference gains AG, EG can correspond to a reference signal output level indicated by the dashed lines of FIGS. 3*a*-3*c*. Then larger volume settings correspond to larger reference gains AG, EG, i.e., to a dashed line in FIGS. 3*a*-3*c* which is shifted towards higher values or has an increased slope.

It should be clear that the entertainment gain determination unit 26 and the announcement gain determination unit 23 operate according to the mixing modes discussed with respect to FIGS. 3*a*-3*c*. Therefore, based on the loudness and based on the volume, certain gain offsets are determined. These gain offsets modify the volume specific gains AG and EG.

Mixer 28*a* amplifies and mixes the audio signals 10*a*, 11*a* for a front playback zone 40, 41, see FIG. 2, and outputs the resulting output audio signal to a respective loudspeaker 15*a*. The mixer 28*b* amplifies and mixes the audio signals 10*a*, 11*a* for a rear playback zone 42, 43, see FIG. 2, and outputs the resulting output audio signal to a respective loudspeaker 15*b*.

Figure 3:
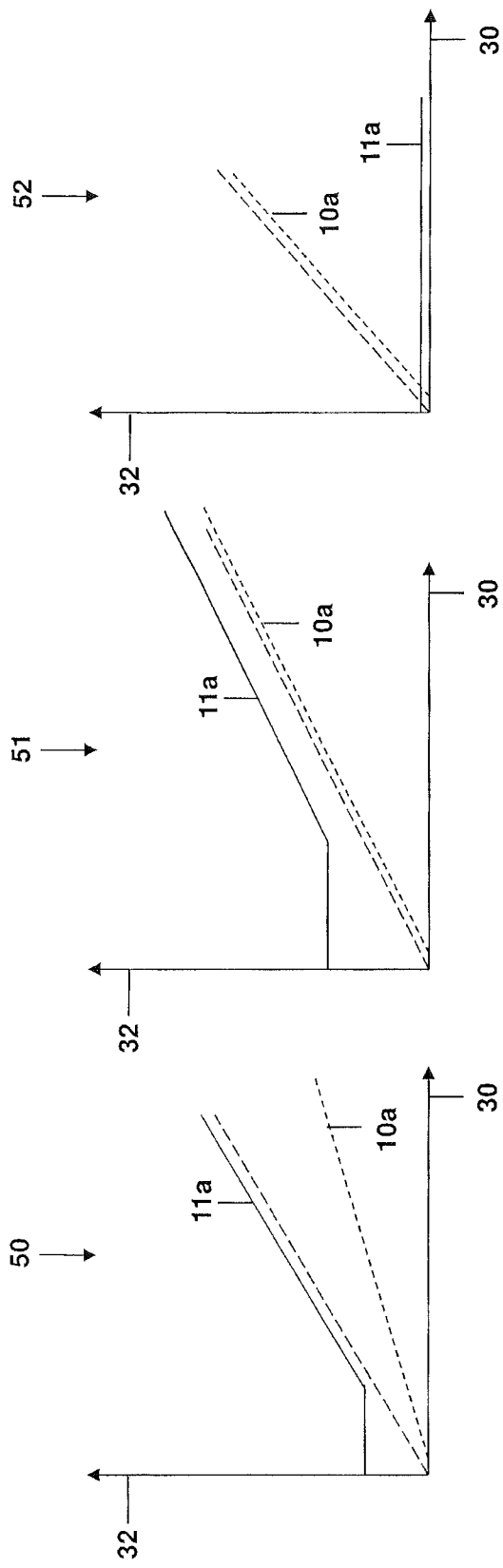
FIG. 3a is an illustration of a dependency of signal gain on loudness for a first mixing mode.
FIG. 3b is an illustration of a dependency of signal gain on loudness for a second mixing mode.
FIG. 3c is an illustration of a dependency of signal gain on loudness for a third mixing mode.

Even though the different entities of FIGS. 1 and 3 have been discussed separately, it should be understood that different entities may be combined in one unit. For example, units 23, 24, 26, 28*a*, and 28*b* can correspond to a single control unit as in FIG. 1. Different entities may be implemented as hardware or software or a combination thereof. For example, it is possible to implement signal power measurement unit 21 and index calculation unit 22 as a single unit executed as software code by a processor. Also, it may be desirable to provide units 23, 24, and 26 as a single unit for example in an audio processor of an on-board computer of a vehicle. It should furthermore be understood that the use of reference signal gains AG, EG is not mandatory. It is also possible, as illustrated with reference to FIG. 1, to have units 23 and 26 output the final signal output gains AAG and AEG directly.

Figure 5:
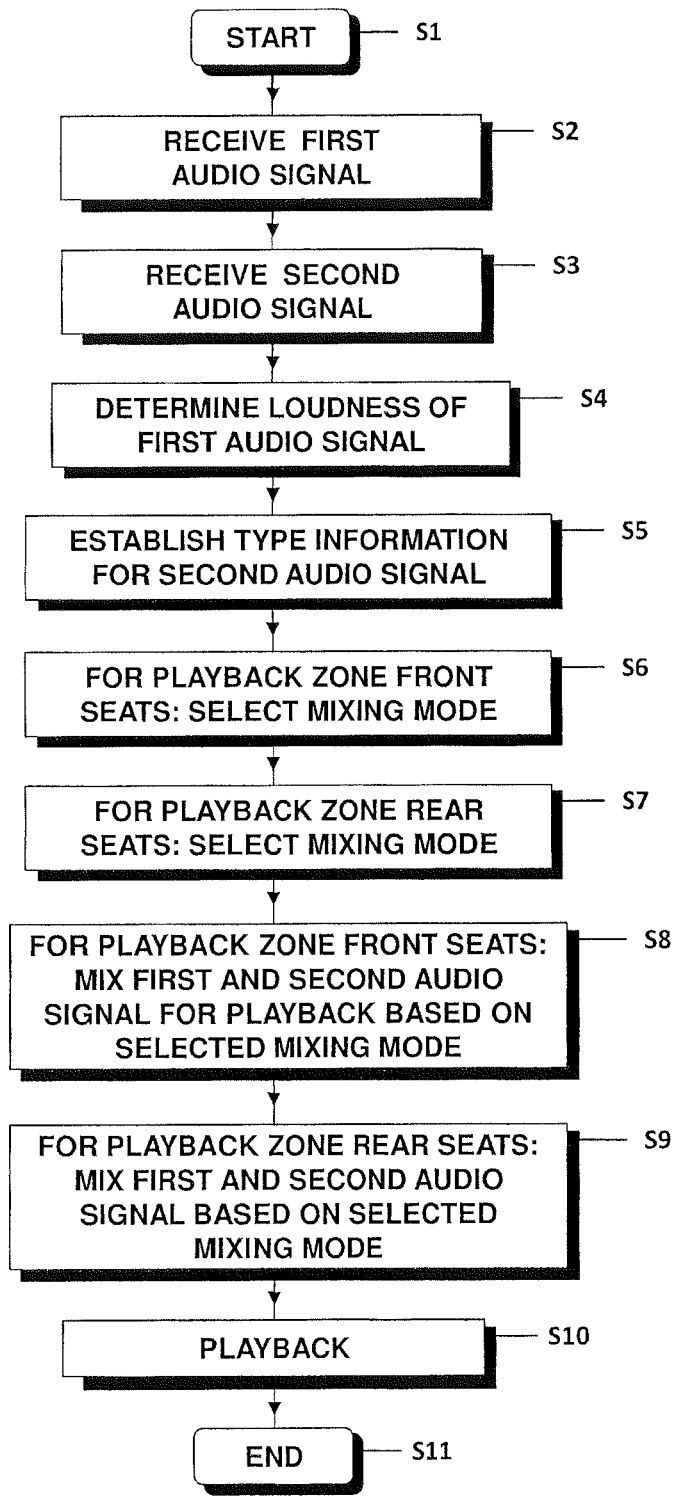
FIG. 5 is a flowchart illustrating a method of mixing a first and a second audio signal.

In FIG. 5, a flowchart illustrates a method according to an embodiment. The method starts with step S1. First, in step S2, a first audio signal is received. The first audio signal relates, for example, to an entertainment audio signal comprising a number of channels. For example, the first audio signal may be received from an audio signal source such as a radio, a CD player, or from the internet. Then, in step S3, a second audio signal is received. The second audio signal relates, for example, to an announcement audio signal such as navigation instructions, front park distance control audio signal, rear park distance control audio signal, status indication of the telephone call, a telephone call, front gong, rear gong.

In step S4, a loudness of a first audio signal is determined, for example in a loudness determination unit comprising an interface for receiving the first audio signal and a processor. The determined loudness can be specified by an index value, for example in an index calculation unit comprising an interface for receiving the determined loudness and a processor. For example, the index can be a numerical value between a minimum and a maximum value where larger index values correspond to a larger loudness value of the first audio signal as received in step S2.

In step S5, type information for the second audio signal as received in step S3 is determined. The type information classifies the different types of second audio signals.

Based on the loudness as determined in step S4 and based on the type information as established in step S5, in steps S6 and S7 a mixing mode is individually selected for a front playback zone in step S6 and a rear playback zone in step S7. The playback zones target at passengers located in the front seats for the front playback zone and passengers located in the rear seats for the rear playback zone. More than two playback zones can be present in a vehicle, for example different playback zones may individually address every passenger located in the vehicle.

The different mixing modes relate to a relation between the signal output gains of the first and second audio signals. This can occur in one embodiment by adaptation of the signal output gains of the audio signal with respect to one or more reference signal output gains related to a volume setting as a function of the loudness as determined in step S4. For example, the reduction of the reference signal output gains can be a function of the determined loudness. The amount of adaptation of the reference signal output gain is a function of the determined type information. The absolute value of amplification can in turn relate to the volume setting. For example, the reference signal output gain can be larger for larger volume settings.

In steps S8 and S9, the two audio signals received in steps S2 and S3 are mixed individually for the front and rear playback zones. Mixing relates to the amplification of the audio signal and the mixing of the audio signals to obtain a single audio signal.

Here it should be understood that the mixing and the setting of the signal gains for the first and the second audio signals, can occur individually for the two playback zones. In particular, for example in the first playback zone, the mixing can occur using different signal output gains than for the mixing in the rear playback zone in step S9.

Then, in step S10, the mixed signals of steps S8 and S9 are output synchronously via loudspeakers to address the front and rear playback zones. In step S11, the method ends.

While specific embodiments of the invention are disclosed herein, various changes and modifications can be made without departing from the scope of the invention. The present embodiments are to be considered in all respects as illustrative and non-restrictive, and all changes coming within the meaning and equivalency range of the appended claims are intended to be embraced therein.

Although the present invention has been illustrated and described with respect to several preferred embodiments thereof, various changes, omissions and additions to the form and detail thereof, may be made therein, without departing from the spirit and scope of the invention.

What is claimed is:

1. A method of mixing a first audio signal and a second audio signal for audio output in at least two playback zones of a vehicle interior, the method comprising:
 receiving the first audio signal and the second audio signal, the first audio signal comprising a plurality of channels;
 determining a loudness of the first audio signal based on a psycho-acoustic model of a human hearing;
 establishing type information of the second audio signal;
 individually selecting, for each of the at least two playback zones of the vehicle interior, a mixing mode depending on the type information of the second audio signal, wherein the mixing mode relates to a relation between signal output gains of the channels of the first audio signal and second audio signal; and
 mixing for playback, in a first one of the at least two playback zones, the plurality of channels of the first audio signal with the second audio signal based on the selected mixing mode and based on the determined loudness, mixing for playback in a second one of the at least two playback zones, the plurality of channels of the first audio signal and the second audio signal based on the selected mixing mode and based on the determined loudness.

2. The method of claim 1, wherein, when individually mixing based on a first mixing mode, a first signal output gain of the first audio signal is decreased by a certain amount if compared to a second signal output gain of the second audio signal, wherein the certain amount depends on the loudness.

3. The method of claim 1, wherein, when individually mixing based on a second mixing mode, a first signal output gain of the first audio signal is left unaltered if compared to a reference signal output gain related to a volume setting and a second signal output gain of the second audio signal is increased if compared to the reference signal output gain.

4. The method of claim 2, wherein when mixing in the first mixing mode or the second mixing mode, a relation between the signal output gains of the first and second audio signals is: signal gain of the second audio signal larger by a predefined factor than signal output gain of the first audio signal, wherein the predefined factor decreases for increasing loudness and wherein the signal output gain of the second output audio signal remains constant below a threshold loudness.

5. The method of claim 3, wherein, when individually mixing based on a third mixing mode, a second signal output gain of the second audio signal is set to zero.

6. The method of claim 1, wherein the second audio signal is an announcement signal and the type information relates to one of the following: navigation instructions, front park distance control audio signal, rear park distance control audio signal, status indication of a telephone call, telephone call, front gong, rear gong.

7. The method of claim 5, wherein if the type information of the second audio signal relates to navigation instructions or status indication of a telephone call, the first mixing mode is selected for a first playback zone targeted at front seat passengers of the vehicle and the third mixing mode is selected for a second playback zone targeted at rear seat passengers of the vehicle.

8. The method of claim 5, wherein if the type information of the second audio signal relates to rear park distance control audio signal or rear gong, the third mixing mode is selected for a first playback zone targeted at front seat passengers of the vehicle and the second mixing mode is selected for a second playback zone targeted at rear seat passengers of the vehicle.

9. The method of claim 5, wherein if the type information of the second audio signal relates to front park distance control audio signal or front gong, the second mixing mode is selected for a first playback zone targeted at front seat passengers of the vehicle and the third mixing mode is selected for a second playback zone targeted at rear seat passengers of the vehicle.

10. The method of claim 1, further comprising synchronous playback of the respective audio signals in each playback zone.

11. The method of claim 1, wherein mixing for playback comprises:
 receiving at least one reference signal output gain related to a volume setting;
 calculating a first signal output gain and a second signal output gain based on the at least one reference signal output gain and the mixing mode and the determined loudness;

amplifying the first audio signal using the first signal output gain;
amplifying the second audio signal using the second signal output gain; and
mixing the amplified first and second audio signals to obtain a single audio signal.

12. A sound system for use in a vehicle, comprising:
a first audio signal source providing a first audio signal, the first audio signal comprising a plurality of channels;
a second audio signal source providing a second audio signal;
a loudness determination unit configured for determining a loudness of the first audio signal based on a psychoacoustic model of a human hearing;
a type information unit configured to establish type information of the second audio signal;
a control unit configured to individually select, for each of at least two playback zones within an interior of the vehicle, a mixing mode depending on the type information of the second audio signal, wherein the mixing modes relate to a relation between signal output gains of the first audio signal and the second audio signal, and configured to mix for playback, in a first one the at least two playback zones, the plurality of channels of the first audio signal with the second audio signal based on the selected mixing mode and the determined loudness, and mixing for playback in a second one of the at least two playback zones, the plurality of channels of the first audio signal with the second audio signal based on the selected mixing mode and based on the determined loudness; and
a plurality of loudspeakers addressing individually the at least two playback zones.

13. The sound system of claim 12, wherein the plurality of loudspeakers address at least two playback zones each targeting to one or more of the following: driver in a front seat of the vehicle, co-driver in a front seat of the vehicle, passenger in a left rear seat of the vehicle, passenger in a right rear seat of a vehicle.

14. The method of claim 1, where the mixing for playback in the first one of the at least two playback zones and the mixing for playback in the second one of the at least two playback zones is different.

* * * * *